(12) United States Patent
Purdy (10) Patent No.: US 7,215,124 B1
(45) Date of Patent: May 8, 2007

(54) METHOD AND APPARATUS FOR IMPROVING THE QUALITY OF KINEMATIC MR IMAGES

(75) Inventor: David Embrey Purdy, Pearland, TX (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 52 days.

(21) Appl. No.: 11/280,634

(22) Filed: Nov. 16, 2005

(51) Int. Cl.
*G01V 3/00* (2006.01)
(52) U.S. Cl. ...................................... 324/318; 324/309
(58) Field of Classification Search ................ 324/318, 324/319, 309, 307, 322; 600/410, 415, 421, 600/422
See application file for complete search history.

(56) References Cited

U.S. PATENT DOCUMENTS

| | | | | |
|---|---|---|---|---|
| 4,694,837 A | * | 9/1987 | Blakeley et al. ............ 600/484 |
| 4,710,717 A | * | 12/1987 | Pelc et al. ................... 324/309 |
| 5,154,178 A | * | 10/1992 | Shah ........................... 600/415 |
| 5,931,781 A | * | 8/1999 | De Boer ..................... 600/415 |
| 6,267,733 B1 | * | 7/2001 | Peterson et al. ............ 600/587 |
| 2005/0096543 A1 | * | 5/2005 | Jackson et al. ............. 600/441 |

* cited by examiner

*Primary Examiner*—Brij B. Shrivastav (57) ABSTRACT

A method and apparatus for magnetic resonance (MR) imaging of a moving object, and in particular MR imaging by retrospectively selecting and sorting the MR data acquired with the known prior positions of an orthopedic joint. A mechanical apparatus limits the motion of the joint while an optical or electronic apparatus determines the instantaneous articulation position of the joint, for example its rotational angle. Either partial or complete MR data are acquired asynchronously with respect to various positions of joint movement, and the MR data are then retrospectively selected and sorted to form images of the joint at the various articulated positions. This retrospective selecting and sorting allows sharp images to be acquired using MR data acquired over several flexions and extensions of the joint, regardless of the periodicity or velocity of its motion.

20 Claims, 3 Drawing Sheets

METHOD AND APPARATUS FOR IMPROVING THE QUALITY OF KINEMATIC MR IMAGES

CROSS-REFERENCE TO RELATED APPLICATIONS

None.

BACKGROUND OF THE INVENTION

1. Field of the Invention

The present invention relates to magnetic resonance (MR) imaging, and more particularly relates to a method and apparatus useful for developing high resolution MR images of an object in motion.

2. Description of the Related Art

It is well known that Magnetic Resonance (MR) images can be degraded by motion during the imaging scan. One particular exemplary application of MR imaging where motion is an issue, is in the field of orthopedics, where physicians find value in viewing not only static images of joints, but also images of the joint while in motion (commonly referred to as "kinematic studies"). In order to provide such images, several devices exist for adjusting and then fixing the position of a joint so as to image it at selected ones of a plurality of different fixed positions. Use of such mechanical devices is undesirable because of the time it takes to repeatedly adjust and then fix the position of the joint to successive new positions, and to individually acquire the MR images at each of those fixed positions. Although movies of joint motion can be created with such devices, such kinematic studies do not demonstrate the dynamic effects of normal movement, such as muscle contraction against resistance and joint compression.

One known magnetic resonance (MR) method for acquiring images of a moving joint uses a very fast pulse sequence of ordinary and well known design to acquire single images in less than one tenth of a second, yielding so-called "real time" imaging of the joint motion. However, the speed of the acquisition reduces the resolution and signal-to-noise ratio (SNR) of the images, and joint motion during this fraction of a second can still cause a degradation of image quality.

Another known method of MR imaging acquires data only at several specific rotational positions as the joint is repeatedly flexed by a motorized apparatus. During each flexion, only a portion of the required data is acquired at each joint position, this acquisition being performed with synchronization of the MR imaging pulse sequence with the motorized drive. The data from several flexions are combined to form complete images at the specified rotational positions. Because a portion of the data may be acquired in a shorter time window than a full data set, blurring is reduced (See for example Shah's U.S. Pat. No. 5,154,178). However, it is not convenient to drive the motion of the joint in this synchronous manner, and the images do not show the natural positions of the tissues as the joint works against resistance.

Another known method of MR imaging triggers a full or partial acquisition of MR data as the joint is flexed, this triggering being initiated by a position measuring device. Because motion during this acquisition period will blur the resulting images, the period is kept short, and the MR imager is halted shortly after the onset of the triggered acquisition. The imager pauses until the position measuring device signals the next desired position (See for example De Boer's U.S. Pat. No. 5,931,781). However, the natural irregular motion of the joint makes these pauses irregular in duration, allowing the tissue magnetization to relax back to its equilibrium value for an irregular time. This changes the amplitude of the acquired signal in an irregular manner, creating image artifacts.

Another known method of MR imaging acquires repeated copies of one data subset during one cycle of tissue motion, this acquisition utilizing one set of position-encoding magnetic field gradients and a steady rhythm which is asynchronous with the cycle of tissue motion. This rhythmic acquisition continues into the next cycle of motion, where, with a different set of position-encoding magnetic field gradients, repeated copies of a second data subset are acquired. This technique is commonly used to acquire one or several position-encoded "Fourier lines" of the beating heart per cycle, the start of each cycle announced by the "R-wave" of the electrocardiogram. Although the varying durations ("periods") of each cycle are known, the exact motion of the, for example, heart tissue during these cycles must be assumed. One such assumption would be that the complex motion of the heart tissue stretches or contracts proportionally with the period of the cycle. After making this or some other assumption to correlate time with position, the data are retrospectively sorted into groups that are presumed to represent specific spatial positions of the heart tissue. The accumulated data in each group are then reconstructed to form images. The steady rhythm of the data acquisition maintains the tissue magnetization in a steady state to reduce image artifacts (See for example Pelc et al's U.S. Pat. No. 4,710,717). However, this technique is not directly applicable to joint imaging, because it assumes that the tissue moves in a predictable pattern from one cycle to the next, even if the period of the cycle changes. During joint imaging, the patient may move the joint in an unpredictable manner following initiation of movement.

Because the technique of Pelc acquires data asynchronous to the movement of the heart, it is clear that, even after a moment in time is estimated to represent a particular spatial position of the heart, it is not possible retrospectively to select an MR data subset that was acquired at precisely this moment. To reduce image artifacts created by this temporal mismatch, two data subsets are linearly interpolated: one is acquired just before this moment, and the other is acquired just after this moment. Only data acquired with the same position-encoding gradient pulse or pulses are interpolated.

SUMMARY OF THE INVENTION

It is advantageous to provide a method for acquiring sharp images of moving tissue, for example joints, where the motion of the joint is controlled voluntarily by the patient so as to be cyclical in nature. It is furthermore advantageous that the data used to reconstruct a specific image be acquired at or very near a carefully measured spatial position in the patient-controlled cycle of motion, regardless of when that position is attained, and that images from a plurality of such positions can be acquired in the same scan of the imager.

To improve the image quality, in accordance with the invention only a portion of the required data is acquired for each measured joint position during one portion of its cycle of movement, such as during knee flexion, and the joint is repeatedly flexed to obtain the full data set. This reduces blur by reducing the time window during which data are acquired. The data subsets from several flexions are combined to form complete images at a plurality of spatial positions during the cycle of motion. The possibility of acquiring a data subset at a specific spatial position from several cycles of movement also permits signal averaging, as desired, by repeating the acquisition of this data subset in subsequent cycles of movement.

Thus, since it is not advantageous to start and stop the MR imager during the irregular motion of the joint, repetitive MR data subsets are acquired asynchronously as the joint flexes. During each joint flexion, multiple signals are sent from a position or angle measuring device to the MR imager, each signal representing one of a plurality of specific positions or angles of the joint. Data subsets acquired very near in time to the signals from the position or angle measuring device, and thus acquired very near in their positions to the desired, measured positions, are retained, while the remaining data are discarded, or are used to form approximate images at separate, estimated rotational positions. During the next cycle of motion, data subsets are again repetitively acquired by the imager, but the position encoding gradients of these subsets differ from those of the first cycle of motion. In this manner, data having all of the required position encoding gradients are acquired as the joint is flexed repetitively, and the data selection process ensures that all of the data used to reconstruct an image from a specific position are acquired with the joint very near that position, even though the motion of the joint may actually be very erratic in time.

A simple MR pulse sequence consists of one radiofrequency (RF) pulse and several magnetic field gradient pulses. One of these pulses will be referred to as the "position-encoding" or "phase-encoding" gradient pulse. It is followed by the "readout" gradient pulse applied in a spatially orthogonal direction, which is applied while a plurality of signal voltage data points are digitized and stored. These data points are referred to as one "Fourier line." This is one "imaging module" (IM) of the pulse sequence, and its duration is called the repetition time or TR. To obtain the data needed to reconstruct an image, a plurality of these sequence elements or IM's must be played out, each of these elements having a different amplitude of the phase-encoding gradient, the other pulses remaining the same. Each of these elements acquires a different Fourier line. By convention, these lines are numbered using the index "k" from negative values to positive values, and the resulting matrix of digitized values is referred to as "k-space." Thus, in the strict sense, the sequence of IM's is not exactly repeated to obtain the various lines of k-space.

In the simplest implementation of the current invention, the repeated element is one imaging module, and it is repeated for one cycle of the object motion. That is, the amplitude of the phase-encoding gradient pulse is constant, the same Fourier line is acquired over and over again, and the time (Time of Day, or TOD) of each of these lines, referenced to the system clock, is recorded. Simultaneously, the time of each signal from the position or angle measuring device, referenced to the system clock, is recorded. As the object begins the next cycle of motion, another required amplitude of the phase-encoding gradient is used, and this Fourier line is acquired repeatedly during this cycle. To obtain the first Fourier line of the first known spatial position, the system clock times of each of the plurality of first Fourier lines is compared to the time that the position measuring device sent its first position signal. The Fourier line acquired closest in time to this signal is chosen as part of the data for the image representing the first known position of the object. Because this line was acquired very close in time to the time that the object passed through the first known position, it can be surmised that this line was acquired at an object position very close to the first known position. This process is repeated for other object positions and other Fourier lines. If interpolation is used, the two Fourier lines closest in time to the position signal are chosen, these Fourier lines having been acquired with the same amplitude of the phase-encoding gradient.

Modern MR imagers are capable of acquiring Fourier lines in less than ten milliseconds, so the same Fourier lines will be acquired many times during one cycle of the joint motion, and only a few of these lines will be needed to match to object positions signaled by the position measuring device. It is advantageous, therefore, to have the repeating group of elements of the MR pulse sequence consist of several imaging modules, each having a different amplitude of the phase-encoding gradient to acquire a different Fourier line. For example, the repeating elements might consist of three imaging modules. The first module acquires Fourier line −128, the second module line −127, and the third module −126. These three elements are repeated throughout the first cycle of object movement, generating the pattern −128, −127, −126, −128, −127, −126, −128, . . . If the position signal is received in the middle of this portion of the pattern, just after the second occurrence of Fourier line −128, this line would be selected from the second repetition of the elements, as would Fourier line −127, and Fourier line −126 would be selected from the first repetition of the elements. If interpolation is desired, Fourier line −128 would be selected from the second and third repetition of the elements, while Fourier lines −126 and −127 would be selected from the first and second repetition of the elements. Interpolation is only performed between lines of the same Fourier number.

This interleaving of Fourier lines dramatically reduces the number of joint cycles that must be imaged to obtain a full data set. However, as the number of Fourier lines in each repeating group of elements increases, some of the selected Fourier lines will have been acquired at a time that is no longer very close to the time of the position signal, increasing image blur, and increasing the importance of interpolation of the lines.

More complex MR pulse sequences have more than one gradient pulse that changes in strength from one Fourier line to the next. The term "position-encoding pulse or pulses" will be used to describe these pulses that vary from one spatial encoding to the next.

Even more complex MR pulse sequences acquire a plurality of digitized voltage values in the presence of a magnetic field gradient pulse that varies in strength and spatial direction. Instead of forming a line in k-space, they follow a spiral path. If the pulse sequence obtains the required k-space data by acquiring a plurality of partial spirals, each obtained in a separate imaging module, then, in accordance with this aspect of the invention, one or more of these sub-spirals may be the repeated elements during one cycle of the object motion. Likewise, instead of forming a line in k-space, the data may follow a zig-zag or raster path. This is referred to as echo planar imaging. If the pulse sequence obtains the required k-space data by acquiring a plurality of partial rasters, each obtained in a separate imaging module, then, in accordance with this aspect of the invention, one or more of these sub-rasters may be the repeated elements during one cycle of the object motion.

Thus, a method for producing an image of an object located in the field of view of an MR imaging system, which image depicts the object at a selected one or more of a plurality of different spatial positions during cyclical movement of the object, comprises the following steps:

(a) applying a position sensing device to the object, said device providing signals to said MR imaging system at the instant when the object passes through said different spatial positions during its cyclical movement;

(b) repeatedly moving the object over a given cycle of movement, and recording with reference to a system clock the specific time that the object was at each of the different spatial positions during successive cycles of its movement;

(c) simultaneously with the repeated movement of the object, repeatedly executing elements of an MR pulse sequence so that the MR imaging system will acquire for each element of the MR pulse sequence a subset of MR data, said execution being asynchronous with respect to said object movement, and said MR pulse sequence including at least one position encoding gradient pulse which is caused to have all values required in order to acquire at least the minimum amount of MR data sets needed to reconstruct an image;

(d) retrospectively selecting the subset of MR data acquired during the execution of each MR pulse sequence element which occurred at the same time or nearly the same time that the object passed through a given one of the plurality of different spatial positions in successive cycles of said object movement, said time being indicated by the signal provided by the position sensing device; and (e) reconstructing an image of the object at the given one of the different spatial positions using the MR data retrospectively selected in step (d).

As noted above, the method of the present invention requires measurement of the joint angulation (or translation). Devices which use existing technology can be used, for example, a goniometer. More specifically, a goniometer is constructed to generate an electrical or optical signal when the moving joint passes through one or more specified angular positions. The general concept of detecting the position of a tissue by optical means, and transmitting that information to an MR scanner has been described by Blakeley, et al. in U.S. Pat. No. 4,694,837.

In accordance with another aspect of the invention, it is not necessary to acquire a goniometer signal for every desired joint angle. As long as the motion between two measured angles does not accelerate appreciably, a linear interpolation of the times of the two measured signals can be used to estimate the time that the joint assumed any desired articulation.

Furthermore, for the construction of movies of the joint motion, it is usually not necessary to specify an exact angle between two measured angles. It is sufficient to select data acquired at a certain fractional time between two known times corresponding to two known angles. For example, one can select data acquired halfway in time between two of the measured goniometer signals. As long as the motion of the joint is reasonably consistent, this criterion will select data from each swing of the joint that are acquired at close to the same joint angle, and will yield an image of good quality, even if the joint angle of this image is not, because of acceleration, exactly halfway between the two known angles. In this respect, the goniometer signals are superior to the corresponding electrocardiogram signals used in prior art cardiac imaging. In cardiac imaging, if the heart rhythm is irregular, the complex cardiac motion must be estimated between just two timing signals (two electrocardiographic R-waves). In contrast, with object motion imaging in accordance with the present invention, the goniometer produces multiple positional signals during one period of motion.

BRIEF DESCRIPTIONS OF THE DRAWINGS

In order to better understand the invention, the accompanying illustrative and non-limiting drawings, which are incorporated herein and constitute part of this specification, illustrate embodiments and details of the invention, and, together with the general description given above and the detailed description given below, serve to further explain the features of the invention.

DETAILED DESCRIPTION OF THE PREFERRED EMBODIMENTS

Figure 1:
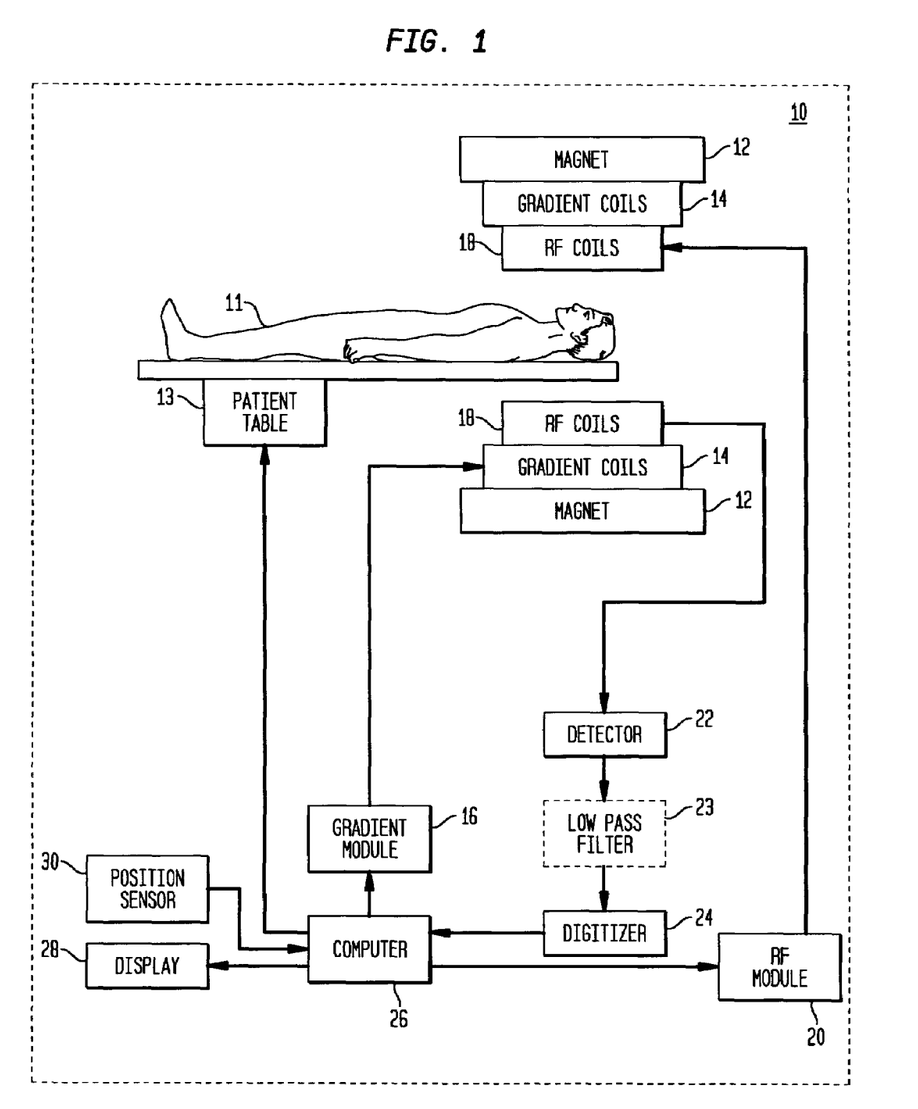
FIG. 1 illustrates an MR imaging system useful for carrying out the method and apparatus of the invention.

FIG. 1 shows a block diagram illustrating the operation of an MR imaging system 10 which may be used in connection with the method and apparatus of the invention. Since such imagers are well known, what follows is only a brief overview description of such a device. In the interest of brevity and clarity, throughout the remaining description only specific changes from known and conventional parameters are provided, in order to give the reader a complete understanding of the invention without undue complexity.

A magnet 12 is provided for creating a static/base magnetic field in a body 11 positioned on a table 13 to be imaged. Within the magnet system are gradient coils 14 for producing position dependent magnetic field gradients superimposed on the static magnetic field. Gradient coils 14, in response to gradient signals supplied thereto by a gradient module 16, produce the position dependent magnetic field gradients in three orthogonal directions. Within the gradient coils is an RF coil 18. An RF module 20 provides RF pulse signals to the RF coil 18, which in response produces magnetic field pulses which rotate the spins of the protons in the imaged body 11 by ninety degrees or by one hundred and eighty degrees or by a different angle useful for the particular imaging technique. In response to the applied RF pulse signals, the RF coil 18 receives MR signals, i.e., signals from the excited protons within the body as they return to an equilibrium position established by the static and gradient magnetic fields, which MR signals are detected by a detector 22 (comprising a preamplifier and amplifier). The MR signals are then filtered by an analog low-pass filter 23, converted into digital signals by a digitizer 24 and applied to the MR systems computer 26. Alternatively, the function of analog low-pass filter 23 may be carried out by subjecting the digital signals supplied from digitizer 24 to digital filtration algorithms in computer 26. In a manner well known to those of ordinary skill in this technology, the gradient magnetic fields are utilized in combination with the RF pulses to encode spatial information into the MR signals emanating from a plurality of slices of the body being imaged. Computer 26, knowing the details of the applied gradient magnetic fields, processes the detected MR signals so as to generate images of a selected slab (or slabs) of the body, which are then shown on a display 28.

As previously noted, the inventive method requires a position sensor or goniometer 30 that can operate in an MR imager. Preferably, the goniometer limits the object to be imaged, such as a knee joint, to a relatively simple and consistent path of motion, and indicates when the joint attains specific angular positions along the path of motion.

Figure 2A:
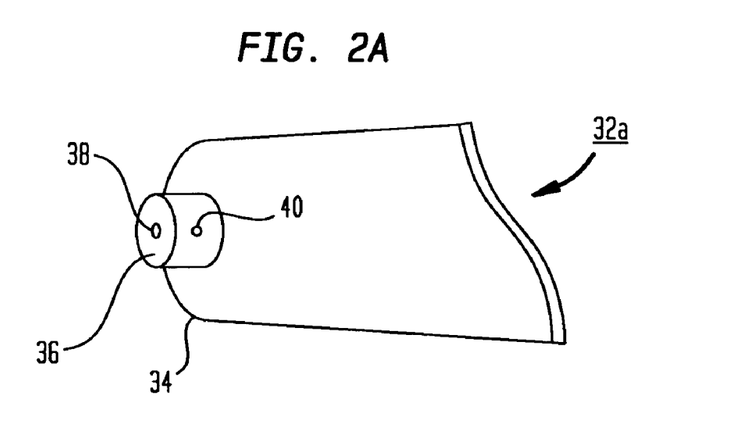
FIGS. 2a, 2b, and 2c illustrate a goniometer useful for carrying out the method and apparatus of the invention.
Figure 2B:
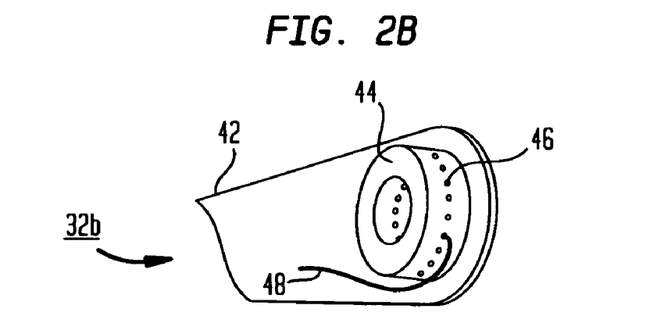
Figure 2C:
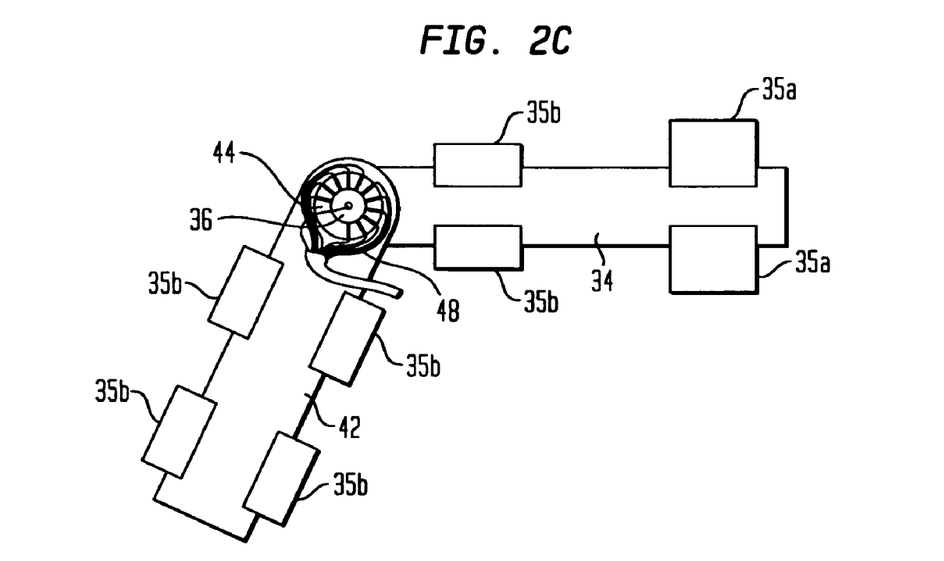

In this regard, an orthopedic brace of the type shown in FIGS. 2a, 2b and 2c is provided, which can preferably fix the joint to be imaged to a specific frame of reference within the field of view of the MR imager. One method and apparatus of the invention is to strap one portion 32a of the brace to one member of the knee joint, for example the upper leg, and to substantially fix that portion of the brace to a fixed position relative to the patient table 13 (which in one embodiment may simply mean that the upper leg of the patient is strapped to a pillow or other support that is used to put the knee joint in a normally bent position), while permitting the other member, for example the lower leg, to move. A measurement device, which can be integral with the brace, detects the relative motion of the fixed and movable parts of the brace or body part. This device is typically a goniometer that measures the changing angle between the fixed and moveable parts of the brace. Prior art techniques for forming such a brace describe potentiometers mounted to the hinge pin of the brace. Since the electrical signal from such a device might experience interference from the changing RF and magnetic fields within the MR imager, in accordance with a preferred embodiment of the invention, use of an optical device would more appropriate. Accordingly, FIG. 2a shows a perspective view of a portion 32a of such a brace, comprising an elongate member 34 adapted to be strapped, for example, to either side of the upper thigh of the patient. FIG. 2c symbolically illustrates two sets of straps 35 used to apply one each of the brace portions 32a to the left and right sides, respectively, of the patients thigh. At one end of each brace portion 32a is a hinge pin 36 having a central hole 38 therein. Hole 38 is adapted to receive a light source, such as a fiber optic cable or a light emitting diode, that shines a narrow beam of light out a hole 40 in the side of hinge pin 36.

FIG. 2b shows a perspective view of a portion 32b of such a brace, comprising an elongate member 42 adapted to be strapped, for example, to either side of the lower leg of the patient. One end of member 42 includes a collar 44 having a central opening 46 adapted to receive the hinge pin 36 therein with a rotational fit. In one embodiment the collar 44 includes a plurality of optical sensors 48, such as fibers 48 (to aid clarity, only one such representative fiber 48 is illustrated in FIG. 2b), having a light receiving end facing the interior of the collar 44. Thus, when the hinge pin 36 is inserted in the collar 44 so as to make the rotational coupling of the joint brace 32, light emanates from hole 40, and as the hinge pin 36 rotates in collar 44 in response to relative angular movement between the upper and lower portions of the leg of the patient, the plurality of light sensing fibers 48 are successively energized so as to indicate in real time the relative angular position of the knee joint.

In an alternative embodiment, instead of collar 44 having the light receiving portion of a plurality of light detecting fibers 48 directed toward hole 40 of the hinge pin 34, the inside of collar 44 could have a black and white striped surface facing hole 40. In this embodiment, the light beam emitting from hole 40 is reflected back to hole 40 where it can be detected by a photocell, not shown. Movement of the light source relative to the striped pattern generates a signal measuring the relative movement of the knee joint as a function of time. For the rotary motion described herein, this device is typically called an optical shaft encoder. For a positive identification of rotational position, a zero position must be defined, and the number and direction of the reflective stripes counted. In the embodiment where the light source and detectors are fiber optic cables, detection of light in one of the receiving fibers positively identifies the rotational position. It is noted that the number of detectors can be as many as are needed so as to provide an appropriate amount of angular position signals over the angular range, as is needed by the MR imaging apparatus to make the desired images. In fact, a greater numbers of position signals is preferred, since one could always choose to use less than all of the ones provided.

After passing out of the magnetic field, the angular position indicating light signals are converted to electrical signals, and a system clock of the MR imager supplies a "time of day" (TOD) signal which is recorded by MR system computer 26 for each detectable angular position as the scan progresses.

Although the above description refers to angular position, it is noted that a brace having linear detectors could also be used to measure the motion of an object to be imaged when the motion of the object is more linear in nature.

Figure 3:
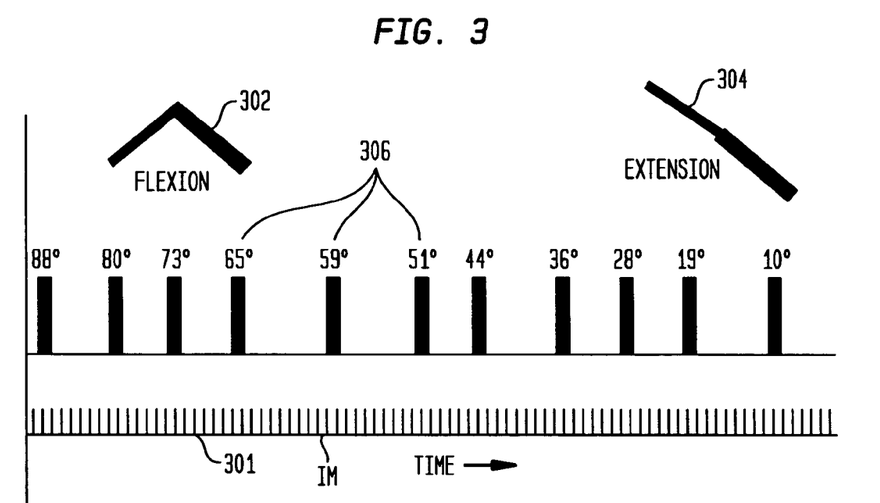
FIGS. 3 and 4 illustrate waveforms useful for understanding the method and apparatus of the invention
Figure 4:
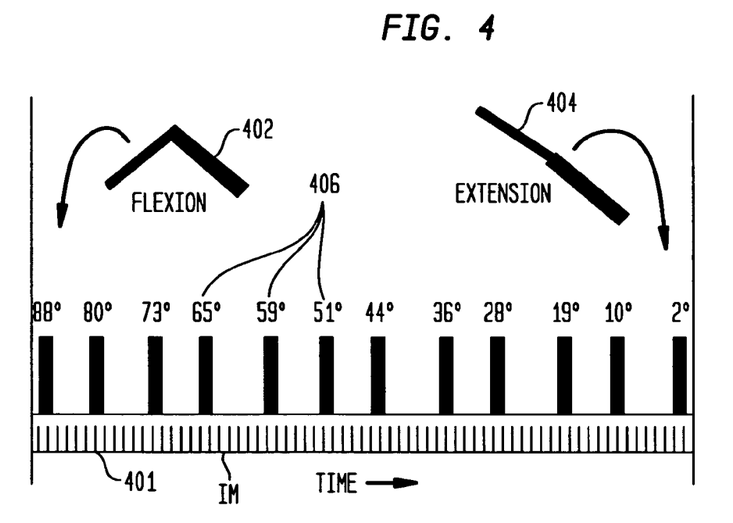

In accordance with one embodiment for implementation of the invention, MR imager 10 repetitively acquires one Imaging Module (IM) of a standard spin warp pulse sequence having a single value of the phase-encoding gradient as the joint flexes and extends, after which the phase-encoding gradient is incremented for the next cycle of data acquisition during flexion and extension. These equally-spaced Imaging Modules are shown by waveform 301 in FIG. 3 for the movement of the leg from flexion 302 to extension 304 during a first cycle of knee joint motion, and are shown by waveform 401 in FIG. 4 for the faster movement of the leg from flexion 402 to extension 404 during a next or successive cycle of knee joint motion. By using the above-noted repetitive IM procedure, successive lines in k-space are acquired for each cycle of motion, for example 92 of the first line in k-space, for the first cycle (FIG. 3), and 73 of the second lines in k-space for a different cycle (FIG. 4). The signals supplied from the goniometer (306 in FIG. 3 and 406 in FIG. 4) during each cycle of the joint motion are used to distinguish not only one cycle of joint motion from the next but also the angular position of the joint as it moves during each cycle from the flexion to the extension position, such as the position signals at 65°, 59° and 51° of the goniometer signals 306 and 406. Each line of digital MR data acquired during this knee joint movement is marked with a digital time (TOD) stamp. After a predetermined acceptable number of phase-encoding IM steps have been acquired (for example 256), the scan stops. For commonly-used pulse sequences, hundreds of lines of data will be acquired during each flexion of the joint, each with the same value of the phase-encoding gradient. In theory, this would permit the reconstruction of images at hundreds of time points, each corresponding to a different rotational angle. In practice, a smaller number of rotational angles will be reconstructed. Among these angles will be the angles for which a goniometer signal was recorded, thereby indicating the time that the joint was at that specific angle. In order to select the correct subset of MR data that was acquired at these angles, the TOD data from the goniometer is compared to the TOD data for each line of the MR data. Having selected a joint angle, the TOD is noted for each flexion (extensions are treated separately, because the joint moves differently as compared with flexion), giving, for example 256 times. The MR data are searched for the lines which were acquired most closely in time to the desired TODs of the selected joint angles. The result is that 256 lines are acquired with a joint angle very close to the desired one. These sub-sets of the MR data are gathered (retrospectively selected and sorted out of all the acquired MR data) and then Fourier transformed to form one image of the joint at the selected joint angle. This data selection and reconstruction process of the invention can then be repeated for each desired joint angle for which an image is desired.

The reconstructed joint angles are not limited to those specifically recorded by the goniometer. In accordance with another aspect of the invention, a time of day halfway between two TODs recorded by the goniometer can be used as another TOD for image reconstruction as long as the joint motion between the recorded TODs is smooth. This interpolation can be continued as needed until the number of reconstructed angles approaches the number of lines acquired during the fastest joint flexion.

In this first embodiment for implementation of the invention, the MR data lines nearest to the desired TOD are used, and data lines acquired just before or just after the utilized lines are discarded if they are not used for another desired TOD (joint angle). In a second embodiment for implementation of the invention, these (temporally) nearby lines are averaged with said lines to improve the SNR of the final image. A disadvantage of this method is that some time resolution is lost.

In a third embodiment for implementation of the invention, the phase encoding gradient is alternated between the first and the second position-encoding amplitude during the first swing of the joint. The desired TODs are determined as above for the desired joint angles. Then the data are search for the two lines of data acquired nearest in time to the desired TOD. Because the phase encoding gradient is alternating between step #1 and step #2, these two lines will necessarily have different gradient amplitudes. During the next cycle of joint movement, the phase encoding gradient is alternated between the third and the fourth encoding amplitudes. This implementation of the invention reduces by 50% the number of joint flexions required to obtain images, while losing some time resolution.

In a fourth embodiment for implementation of the invention, the phase-encoding gradient is stepped among three values, #1, #2, and #3, during the first swing of the joint. That is, the repeated group of sequence elements contains three Imaging Modules. The desired TODs are determined as above for the desired joint angles. Then the data are searched (retrospectively sorted) for selecting the three lines of data acquired closest in time to the desired TOD. Because the phase-encoding gradient has the amplitude pattern #1, #2, #3, #1, #2, #3, these three lines will necessarily have three different phase-encoding amplitudes. During the next cycle of joint movement, the phase encoding gradient is stepped among the between the fourth, fifth, and sixth encoding amplitudes. Compared to the first proposed method, this reduces the number of joint flexions required to obtain images by a factor of three. It is clear that this method can be extended to gradient patterns of any length, to further reduce the imaging time, and that the time resolution of the images becomes coarser as the pattern in extended. For the three-step example, phase encodings #1, #2, and #3 are acquired at different moments, and thus different joint angles, but are reconstructed in a single image. As the gradient pattern is extended, this angle error increases. Pelc, et al. have described an interpolation between different acquisitions of the same phase encoding in U.S. Pat. No. 4,710,717, and this method may be applied to the proposed method.

In a fifth embodiment for implementation of the invention, the sequence is run multiple times with all of the phase encoding steps during a single flexion of the joint. This gives a "real-time" image without the need to select data using the TOD. These images may exhibit blur because of joint motion during the extended period of time needed to acquire all of the phase encoding lines. In addition, the sequence parameters needed to acquire images so rapidly may lead to poor SNR. In the proposed method, similar additional data are acquired during additional joint flexions. Two enhanced reconstruction methods are then possible. In the first method, the effective TOD (k=0 Fourier line) of each full image MR data set is determined, and these TODs are compared to the goniometer TODs to estimate, by interpolation, the joint angle. Then images from different flexion cycles but nearly the same estimated joint angle can be averaged to improve SNR. A second, and superior method of enhanced reconstruction is possible. Because this implementation acquires all of the phase encoding steps multiple times, it is not necessary to use one monotonic series of lines (phase encoding steps –128, –127, –126, . . . , 125, 126, 127) for the image reconstruction. This window of 256 lines can be shifted, for example, to –103, –102, –101, . . . , 126, 127, –128, –127, –126, . . . , –105, –104. The reconstruction software proceeds as above to estimate the joint angles for each MR data set. The additional step is to select roughly corresponding estimated joint angles from the several joint flexions, and compute an average estimated joint angle from the data sets that are to be averaged. This average joint angle will correspond to a different TOD for each flexion. The reconstruction algorithm then shifts the window of, say, 256 lines so that the window is centered at the TOD of the average joint angle. This shift cannot move the important central phase encoding line; this is acquired at a nonideal TOD and joint angle, It does, however, utilize other phase encoding lines that are acquired at joint angles as near as possible to the joint angles of the other data sets in the average. Such shifting is described for cardiac imaging by Bernstein et al. in U.S. Pat. No. 5,377,680. In this fifth implementation, it is also desirable to employ the interpolation between lines of the same phase encoding described by Pelc, et al. in U.S. Pat. No. 4,710,717. Under ideal conditions, this has the effect of estimating what each phase-encoding line would be at the average joint angle. The shifted and interpolated data sets are then averaged to improve the SNR. The positional information available from the goniometer pulses allows many such real time imaging techniques to be applied to multiple, irregular motions of joints to permit signal averaging.

In a sixth embodiment for implementation of the invention, the segmentation of the phase encoding of the fourth implementation is combined with the shifting and interpolating method described in the fifth implementation, above. For example, if the repeated sequence elements contained a large number of Imaging Modules, and if the important k=0 Fourier line were acquired at a time not very near a goniometer pulse, a new angle can be estimated from the two closest goniometer pulses, and the data from all of the joint cycles can be shifted and interpolated as described above. In this manner, all of the k-space lines are estimated at the joint position of the k=0 Fourier line.

These implementations are described using a spin warp pulse sequence and linear ordering of the phase-encoding gradient steps. However, the concepts are equally applicable to other segmentable pulse sequences like projection reconstruction, spiral techniques, echo planar techniques, and can also be applied to other (e.g., interleaved) phase-encoding patterns. The averaging described in the fifth embodiment for implementation of the invention can be applied to single-shot pulse sequences that cannot easily be segmented.

For the purposes of promoting an understanding of the principles of the invention, reference has been made to the preferred embodiments illustrated by the drawing, and specific language has been used to describe these embodiments. However, this specific language is not intended to limit the scope of the invention, and the invention should be construed to encompass all embodiments that would normally occur to one of ordinary skill in the art. For example, the particular implementations shown and described herein are illustrative examples of the invention and are not intended to otherwise limit the scope of the invention in any way. For the sake of brevity, conventional electronics, control systems, and other functional aspects of the systems (and components of the individual operating components of the systems) may not be described in detail. Furthermore, the connecting lines, or connectors shown in the figures are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

Accordingly, it is intended that the present invention not be limited to the described embodiments, but that it has the full scope defined by the above language and the following claims, as well as equivalents thereof.

The following claims provide further details concerning the elements, actions, and/or steps that are contemplated as falling within the scope of the methods and apparatus of the present invention.

What is claimed is:

1. A method for producing an image of an object located in the field of view of an MR imaging system, which image depicts the object at a selected one or more of a plurality of different spatial positions during cyclical movement of the object, the steps comprising:
   (a) applying a position sensing device to the object, said device providing signals to said MR imaging system at the instant when the object passes through said different spatial positions during its cyclical movement;
   (b) repeatedly moving the object over a given cycle of movement, and recording with reference to a system clock the specific time that the object was at each of the different spatial positions during successive cycles of its movement;
   (c) simultaneously with the repeated movement of the object, repeatedly executing elements of an MR pulse sequence so that the MR imaging system will acquire for each element of the MR pulse sequence a subset of MR data, said execution being asynchronous with respect to said object movement, and said MR pulse sequence including at least one position encoding gradient pulse which is caused to have all values required in order to acquire at least the minimum amount of MR data sets needed to reconstruct an image;
   (d) retrospectively selecting the subset of MR data acquired during the execution of each MR pulse sequence element which occurred at the same time or nearly the same time that the object passed through a given one of the plurality of different spatial positions in successive cycles of said object movement, said time being indicated by the signal provided by the position sensing device; and
   (e) reconstructing an image of the object at the given one of the different spatial positions using the MR data retrospectively selected in step (d).

2. The method of claim 1, wherein:
   step (c) repeatedly executes the same element of the MR pulse sequence, said same element having an unvarying position-encoding gradient pulse or pulses, during a given cycle of the object movement, and during a next cycle of the object movement, repeatedly executing an element of the MR pulse sequence having a different position-encoding gradient pulse or pulses than was executed during the prior cycle of object movement.

3. The method of claim 2 where the element repeatedly executed during each cycle of object movement comprises a sequence of RF and position encoding gradient pulses that acquires a single Fourier line.

4. The method of claim 2, where the element repeatedly executed during each cycle of object movement comprises a sequence of RF and position-encoding gradient pulses that acquire one sub-spiral of a segmented spiral sequence.

5. The method of claim 2, where the element repeatedly executed during each cycle of object movement comprises a sequence of RF and position-encoding gradient pulses that acquire one sub-raster of a segmented echo planer sequence.

6. The method of claim 1, wherein:
   step (c) repeatedly executes a first group of elements of the MR pulse sequence, said elements in said first group each having a different position-encoding gradient pulse or pulses from the other elements in the group during a given cycle of the object movement, and during a next cycle of the object movement, repeatedly executing a different group of elements of the MR pulse sequence, said elements of said different group each having a different position-encoding gradient pulse or pulses than was executed during the prior cycle of object movement and different from each other, said first and different groups each have the same number of elements.

7. The method of claim 6, where said first group of elements comprises a sequence of RF and position encoding gradient pulses that acquire a plurality of different Fourier lines, a different plurality of said Fourier lines being acquired in the next cycle of object movement.

8. The method of claim 6, where said first group of elements comprises a sequence of RF and position-encoding gradient pulses that acquire a plurality of different sub-spirals of a segmented spiral sequence, each sub-spiral having at least one different position encoding gradient, a different plurality of said sub-spirals being acquired in the next cycle of object movement.

9. The method of claim 6, where said first group of elements comprises a sequence of RF and position-encoding gradient pulses that acquire a plurality of different sub-rasters of the segmented echo planer sequence, each sub-raster having at least one different position encoding gradient, a different plurality of said sub-rasters being acquired in the next cycle of object movement.

10. The method of claim 1, where step (d) comprises selecting two of said data subsets acquired with the same position-encoding gradient pulse or pulses which are nearest in time to the moment when the object passed through each one of the plurality of different spatial positions in a given cycle of object movement, and then performing an interpolation of the so selected data subsets to provide a data set for use by step (e), which estimates data which would have been acquired by said MR imager at said moment.

11. The method of claim 1, wherein said applied position sensing device limits the cyclical movement of the object to a range of rotational movement about a single axis while providing feedback signals of the angular position at a plurality of angles over said range of rotation.

12. The method of claim 1, wherein said applying step (a) includes a step of applying to the object a device that resists the movement of said object.

13. The method of claim 1, wherein said applying step (a) includes a step of applying to the object a device that assists the movement of said object.

14. The method of claim 2 where the element repeatedly executed during each cycle of object movement comprises a sequence of RF and position encoding gradient pulses that acquires a single projection of a projection reconstruction sequence.

15. The method of claim 6, where said first group of elements comprises a sequence of RF and position encoding gradient pulses that acquire a plurality of different projections of a projection reconstruction sequence, a different plurality of said projections being acquired in the next cycle of object movement.

16. An MR imaging system for producing an image of an object located in the field of view of the MR imaging system, which image depicts the object at a selected one or more of a plurality of different spatial positions during cyclical movement of the object, the system comprising:
   a position sensing device applied to the object, said device providing signals to said MR imaging system at the instant when the object passes through said different spatial positions during its cyclical movement, said MR imaging system recording with reference to a system clock the specific time that the object reaches the different spatial positions during successive cycles of repeated cyclical movement; and
   a controller of said MR imaging system for causing said MR imaging system to repeatedly execute elements of an MR pulse sequence simultaneously with the cyclical movement of the object, so that the MR imaging system will acquire for each element of the MR pulse sequence a subset of MR data, said execution being asynchronous with respect to said object movement, and said MR pulse sequence including at least one position encoding gradient pulse which is caused to have all values required in order to acquire at least the minimum amount of MR data sets needed to reconstruct an image;
   said controller retrospectively selecting the subset of MR data acquired during the execution of each MR pulse sequence element which occurred at the same time or nearly the same time that the object passed through a given one of the plurality of different spatial positions in successive cycles of said object movement, said time being indicated by the signal provided by the position sensing device; and
   said controller reconstructing an image of the object at the given one of the different spatial positions using the retrospectively selected MR data.

17. The apparatus of claim 16, wherein:
   said controller repeatedly executes the same element of the MR pulse sequence, said same element having an unvarying position-encoding gradient pulse or pulses, during a given cycle of the object movement, and during a next cycle of the object movement, repeatedly executing an element of the MR pulse sequence having a different position-encoding gradient pulse or pulses than was executed during the prior cycle of object movement.

18. The apparatus of claim 17 where the element repeatedly executed during each cycle of object movement comprises a sequence of RF and position encoding gradient pulses that acquires a single Fourier line.

19. The apparatus of claim 16, wherein:
   said controller repeatedly executes a first group of elements of the MR pulse sequence, said elements in said first group each having a different position-encoding gradient pulse or pulses from the other elements in the group during a given cycle of the object movement, and during a next cycle of the object movement, repeatedly executing a different group of elements of the MR pulse sequence, said elements of said different group each having a different position-encoding gradient pulse or pulses than was executed during the prior cycle of object movement and different from each other, said first and different groups each have the same number of elements.

20. The apparatus of claim 19, where said controller causes the first group of elements to comprise a sequence of RF and position encoding gradient pulses that acquire a plurality of different Fourier lines, and causes a second group of elements to comprise a sequence of RF and position-encoding gradient pulses that acquire a different plurality of said Fourier lines in a next cycle of object movement.

* * * * *